United States Patent [19]

Gen et al.

[11] Patent Number: 4,584,238
[45] Date of Patent: Apr. 22, 1986

[54] ULTRATHIN CHEMICALLY RESISTANT MARKING SYSTEM AND METHOD OF PRODUCING THEREFOR

[75] Inventors: Tamar G. Gen, Mountain View; Karen M. Biddick, Palo Alto; Erling Hansen, Los Altos, all of Calif.

[73] Assignee: Raychem Corporation, Menlo Park, Calif.

[21] Appl. No.: 626,361

[22] Filed: Jun. 29, 1984

[51] Int. Cl.$^4$ .................. B32B 27/00; C09J 7/02; B42D 15/00
[52] U.S. Cl. .................. 428/349; 428/195; 428/377; 428/516; 428/344; 428/906; 283/83; 283/94; 283/109; 40/316; 40/630; 40/2 R
[58] Field of Search .............. 428/195, 377, 395, 516, 428/40, 42, 906, 349, 344

[56] References Cited

U.S. PATENT DOCUMENTS

| | | | |
|---|---|---|---|
| 2,914,166 | 11/1959 | Bihler | 206/820 X |
| 4,313,986 | 2/1982 | Magnotta | 428/40 |
| 4,391,853 | 7/1983 | Pointon | 428/42 |

*Primary Examiner*—Patricia C. Ives
*Attorney, Agent, or Firm*—Ira David Blecker

[57] ABSTRACT

There is disclosed an ultrathin chemically resistant marking system. The system comprises at least one layer of a chemically resistant adhesive film and printed matter which together cooperate to form a marker. The adhesive film is made of a material selected from the group of polymers which adhere to a substrate upon the application of heat and which are resistant to caustic solutions and solvents, such as methylene chloride. The adhesive film has a chemically resistant front and rear surface and an adhesive rear surface for adhering to a substrate. One of the front or rear surfaces contains the printed matter. There is also disclosed a method for producing an ultrathin chemically resistant marking system.

29 Claims, 5 Drawing Figures

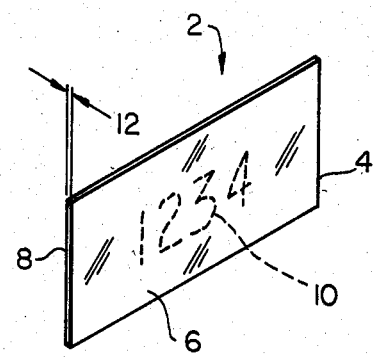
FIG_1
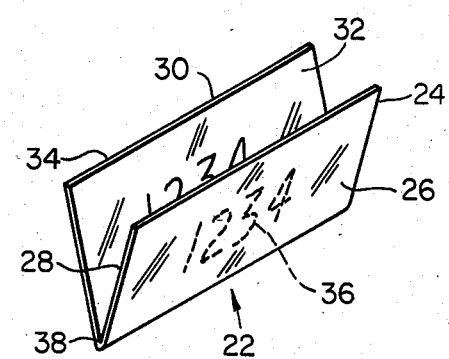
FIG_2
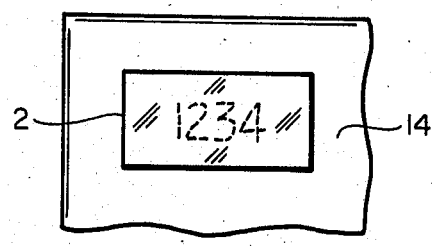
FIG_3
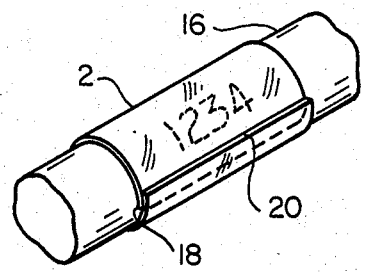
FIG_4
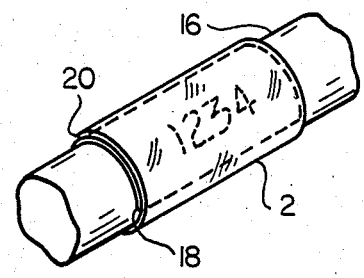
FIG_5

ULTRATHIN CHEMICALLY RESISTANT MARKING SYSTEM AND METHOD OF PRODUCING THEREFOR

BACKGROUND OF THE INVENTION

This invention relates to the field of markers and particularly to those markers which are very thin and also have the combined properties of adhesion and resistance to a variety of chemicals.

In conjunction with various electrical and electronic components, identifying markers are necessary for providing identification or other relevant information about the particular component. For example, individual wires in a bundle or harness may be identified by wraparound markers. Here, wraparound markers are used for identification.

Other components, such as printed circuit board laminates, need markers that serve the purpose of identification but that are also resistant to a variety of chemicals. Printed circuit board laminates, for example, go through a series of chemical baths that all but destroy presently available markers. Since printed circuit board laminates must maintain their identification for process or lot traceability, the fact that presently available markers are unsatisfactory represents a severe problem to the electronics industry.

Additionally, since the laminates may be stacked closely together to form a multilayer printed circuit board, a very thin marker is practically a necessity. A very thin marker would be extremely desirable in other areas of application as well, for example, to avoid excessive buildup when marking densely bundled electrical wires in a harness or when marking the outside of the bundle or harness itself. In the latter situation, the smallest outer diameter possible is desirable.

Presently available marker materials are generally papers or plastics (e.g., polyethylene) which are used in conjunction with an adhesive. An adhesive is never used alone as a marker material but always with one of the previously mentioned materials. These materials are unsatisfactory since they are not sufficiently chemically resistant.

Accordingly, it is an object of this invention to have an identifying marker that is resistant to a variety of chemicals.

It is another object of this invention to have an identifying marker that is very thin in thickness.

It is still another object of this invention to have an identifying marker that is economical, convenient to produce and easily applied.

These and other objects will become apparent after reference to the drawings in conjunction with the following description of the invention.

BRIEF SUMMARY OF THE INVENTION

According to the invention there is disclosed an ultrathin chemically resistant marking system. The marking system comprises at least one layer of a chemically resistant adhesive film in conjunction with printed matter. The adhesive film is made from a group of polymers which adhere to a substrate and which are resistant to caustic solutions and solvents, such as methylene chloride. At least one layer of the chemically resistant adhesive film has a chemically resistant front and rear surface and an adhesive rear surface for adhering to a substrate. One of the front or rear surfaces contains the printed matter. The layer of adhesive film and the printed matter cooperate to form a marker.

Such a marker will be resistant to a variety of chemicals and will also be very thin. Thus, the marker of the instant invention will achieve the objects of the invention.

There is also disclosed a method of producing an ultrathin chemically resistant marking system.

BRIEF DESCRIPTION OF THE DRAWINGS

FIG. 1 is a perspective view of a first embodiment of the ultrathin chemically resistant marking system.

FIG. 2 is a perspective view of a second embodiment of the ultrathin chemically resistant marking system.

FIG. 3 is a plan view of the ultrathin chemically resistant marking system attached to a planar substrate.

FIG. 4 is a perspective view of the ultrathin chemically resistant marking system wrapped around a substrate.

FIG. 5 is a perspective view of a second embodiment of the ultrathin chemically resistant marking system wrapped around a substrate.

DETAILED DESCRIPTION OF THE INVENTION

According to the invention there is disclosed an ultrathin chemically resistant marking system. The marking system comprises at least one layer of a chemically resistant adhesive film and printed matter which cooperate to form a marker. The adhesive film is made from an adhesive thermoplastic polymer or copolymer. The adhesive film has a chemically resistant front and rear surface and an adhesive rear surface for adhering to a substrate. One of the front or rear surfaces contains the printed matter.

The adhesive thermoplastic polymeric material, according to the invention, should satisfy the following requirements. It is necessary that the material adhere to a substrate when applied at a temperature less than about 600° F. At temperatures higher than about 600° F., there may be delamination of the substrate material which, for example, may be a printed circuit board laminate. So as to maintain print legibility, there should be a minimum flow of the adhesive material. Also for print legibility, the material should have optical clarity so that the printed matter can be read through the material. It is also necessary that the material be chemically resistant to chemical baths of caustic solutions and solvents, particularly methylene chloride, up to temperatures of about 190° F. Finally, there should be minimum transference the chemicals making up the chemical bath when the material is tranferred between the various chemical baths. This transference in the prior art materials is believed due to first, the degradation of the marker material and, second to the ionic attraction of the chemicals to the marker material. The materials of the instant invention are relatively inert and thus avoid this transference.

There are a number of material that will satisfy these requirements and that will also achieve the objects of the invention.

Generally, the preferred material are modified ethylene vinyl acetate and modified polyolefins such as polyethylene, polypropylene, polybutene, polyisoprene, and their polymers. The ethylene vinyl acetate and polyolefins are modified by attaching (e.g., by grafting) strong polar groups such as anhydrides, acid groups, and cyano groups.

The more preferred materials are polyethylene and polypropylene modified by grafting acrylic acid groups. The most preferred material is the ethylene vinyl acetate modified by grafting anhydride groups.

As will become more apparent hereafter, these materials are the most chemically resistant and most adhesive of all the materials evaluated. Thus, these materials when incorporated into a marker will have the most advantageous properties over the prior art markers.

Further, copolymers may be polymerized in which one of the monomers contains the strong polar groups. It is believed that these copolymers will exhibit the same advantageous properties as the above described modified polymers.

It is preferred that the adhesive film be very thin so that one layer by itself or several layers of material combined would not cause a noticeable buildup due to the markers. The preferred thickness is less than about 0.005 inch. For some applications the preferred thickness may be less than about 0.001 inch.

While the marking system as just described will perform satisfactorily in practice it is preferred that the adhesive film be surface treated, such as by cross-linking. Surface cross-linking should be understood to mean that the adhesive film is cross-linked to a depth less than the thickness of the adhesive film. When the adhesive film is surface cross-linked this limits the flowability of the surface of the film so as to avoid obscuring the printed matter. It should be understood, however, that the printed matter is still readable even when the film is not surface cross-linked. Also, when the adhesive film is only surface cross-linked the adhesive quality of the film is not affected.

Referring to the drawings in more detail, and particularly referring to FIG. 1, there is shown the ultrathin chemically resistant marker 2. There is the adhesive film 4 having a front surface 6 and an adhesive rear surface 8. The adhesive rear surface 8 contains the printed matter 10. However, while not shown, it is within the scope of the invention to have front surface 6 contain the printed matter. The printed matter 10 may be added by any known printing means such as a typewriter or non-impact printer. When the material is cross-linked the depth of the cross-linking will be less than the thickness 12 of the adhesive film.

FIG. 3 shows the marker attached to a substrate 14. The marker will be planar. It should also be understood that planar can mean substantially planar or near planar.

FIG. 4 shows the marker 2 wrapped around a substrate 16. In this case a first edge of the marker 18 is adjacent to a second and opposite edge 20 of the marker. The printed matter has been printed on the back side of the marker. Alternatively, the front of the marker could have contained the printed matter, particularly where a corrosive environment is not expected.

FIG. 5 shows a modification of the wraparound marker of FIG. 4. In this case, the first edge 18 of the marker is no longer adjacent to second and opposite edge 20. With this embodiment, second edge 20 extends substantially beyond first edge 18 so as to provide an overlapped area. The overlapping is provided so that, for example, printed matter may be applied to the front surface of the marker near first edge 18 and then overlapped with that part of the marker near second edge 20. In this way, the printed matter is protected from the environment.

In another embodiment of the invention the marking system may comprise at least a second layer of the adhesive film which contacts the one layer of adhesive film so that the printed matter is between the layers of adhesive film. In this embodiment the layers of adhesive film and printed matter cooperate to form a multilayer marker. It should be noted that when there are two or more layers, each layer may be the same material as each of the other layers or may be made of different material, just so long as all the layers are made from the preferred materials.

This embodiment of the marking system is illustrated in FIG. 2. In FIG. 2 there is shown an ultrathin chemically resistant marking system 22 having one layer of adhesive film 24 having a front surface 26 and an adhesive rear surface 28. There is also a second layer 30 of the adhesive film which will contact the adhesive rear surface of the first layer 24 of adhesive film. The second layer has a front surface 32 and an adhesive rear surface 34. Located between the two layers of adhesive film is the printed matter 36. It is not important to the invention whether the printed matter is printed on the front surface 32 of adhesive film 30 or the adhesive rear surface 28 of adhesive film 24. It is desirable, however, that the printed matter be located between the layers of adhesive film.

The two layers of adhesive film may be connected such that the multilayer marker may be formed by simply folding the two layers together along fold line 38. However, it is also contemplated within the scope of the invention that the two layers of adhesive film may be entirely separate and that the markers are formed by simply placing one layer of adhesive film over another layer of adhesive film. This particular embodiment is not shown.

As with the first embodiment of the ultrathin chemically resistant marking system the marker 22 may be attached to a substrate 14 or may be wrapped around a substrate 16 as previously described with respect to the single layer embodiment of the marking system.

It may be found desirable to cross-link the material. When there are two layers of material, the top layer of material may be cross-linked through its entire thickness. Under certain circumstances, it may be found desirable to only surface cross-link both layers.

In either of the embodiments the adhesive film is attached to the substrate 14 by heating the adhesive film which causes the adhesive to adhere to the substrate. When the maker is wrapped around a substrate such as substrate 16, the respective ends 18, 20 of the marker may be joined by heating only at the ends or heat may be applied around the entire circumference.

There is also disclosed according to the invention a method of manufacturng an ultrathin chemically resistant marking system. The method comprises the steps of first forming at least one layer of an adhesive film. The film may be formed by any of the known methods as, for example, blowing. The adhesive film may be any of the adhesive thermoplastic polymers described earlier. The adhesive film has a chemically resistant front and rear surface and an adhesive rear surface for adhering to a substrate. The next step in the method is adding printed matter to one of the front and rear surface of the adhesive film. Printed matter may be added by any of the well known methods such as by typewriter, or non-impact printer. The adhesive film and the printed matter cooperate together to form a marker.

Preferred materials are polyethylene and polypropylene modified by grafting acrylic acid groups. The most preferred material is ethylene vinyl acetate modified by grafting anhydride groups.

An optional step in the method is cross-linking the film to a depth less than its thickness. The reason for this surface cross-linking is as discussed above.

The method may further comprise the steps of forming at least a second layer of the adhesive film and then contacting the first layer of adhesive film with the second layer of adhesive film so that the printed matter is between the layers of adhesive film. The forming of the second layer of film may be by the same process as the first layer of the adhesive film. The manner in which the two layers of adhesive film are contacted is not important to this invention. That is, two separate layers of film may be contacted or a single large layer of adhesive film may be folded together as previously described, to form two layers of film.

When the ultrathin chemically resistant marking system is produced as above described the layer of adhesive film and the printed matter may cooperate to form a marker. Or in the case where there are two or more layers of adhesive film then the layers of adhesive film and the printed matter may cooperate to form a multi-layer marker.

In one embodiment of the invention, the marker may be attached to a planar or substantially planar substrate. In another embodiment, the marker may be wrapped around a substrate to form a wraparound marker.

The ultrathin chemically resistant marking system of the instant invention has several advantages over the presently available marking system. Of paramount importance are the adhesive qualities and chemical resistance of the marking system of this invention. It is, of course, known that the preferred polymers of the invention, as previously described may be used as adhesives or for laminating or coating a substrate. However, the adhesive qualities and chemical resistance of these polymers has never been recognized or appreciated in connection with their potential use as markers.

The advantage of the marking system of this invention will become apparent after reference to the test results which follow.

Testing was conducted to evaluate materials for application as a chemical resistant marker for printed circuit boards and printed circuit board laminates. The marker is in the form of a printed thin adhesive film that would provide a permanent label when adhered to a printed circuit board or laminate surface. The label must be resistant to various chemicals and not transfer contamination when exposed to a series of baths, retain optical clarity, and possess minimum flow characteristics to eliminate print distortion. The most important criteria for testing was adhesion to a printed circuit board and chemical resistance.

For board adhesion tests materials were first pressed into thin films, usually 2 to 3 mil thick and print applied with a standard office typewriter. These markers were then heat-pressed into the surfaces of both fiberglass and copper-clad printed circuit boards. Melt temperatures of the markers had to be reached to insure good adhesion but without delaminating the board. The upper temperature limit is about 600° F. Several materials failed because of their high melt temperatures. To pass the markers must not be able to be peeled or rubbed off of either surface (copper-clad board being the more limiting) and the print must remain legible.

Chemical resistance was evaluated by visual inspection of the material after immersion in solvent for 30 minutes. Three solvents were tested:

(1) Methylene chloride—Solvent at room temperature, material tested in pellet form only.

(2) Methyl cellosolve (ethylene glycol monomethyl-ether), ethylene glycol, KOH, and water solution—solvent heated to 190° F. material tested in pellet form, and as in place board marker.

(3) Methyl carbitol (diethylene glycol monomethyl-ether) ethylene glocol, KOH, and water solution—solvent heated to 190° F., material tested in pellet form and as in place board marker.

The methyl cellosolve and methyl carbitol solutions were rigorous solvents and partially destroyed the integrity of the circuit boards during the testing. Several materials discolored but remained intact in these solvents. To pass, markers had to remain adhered, intact, and legible.

Table I lists the materials tested and their performance on a relative pass/fail basis.

TABLE I

| Substrate | Board Adhesion | Methyl Carbitol | Methyl Cellosolve | Methylene Chloride |
|---|---|---|---|---|
| Alathon 2020 MDPE | F | P—* | —$^a$ | P$^b$ |
| Alathon 7030 HDPE | F | — | — | P |
| DPD 9169 EVA | F | P— | — | P |
| DPDA 6182 EVA | F | P— | — | P |
| Reichold 1016 polypropylene/ EPDM rubber +6% acrylic acid | P— | P | F | P |
| Gulf 2604 MDPE | F | — | — | P |
| Gulf 9606 HDPE | F | P— | — | P |
| Hytrel 4052 polyester | P— | F | — | F |
| Hytrel 6346 polyester | P— | F | — | F |
| Kraton G SBS | F | P— | — | F |
| Kraton G/Marlex | F | P— | — | — |
| Macromelt 6301 polyamide | — | F | — | F |
| Marlex 6003 HDPE | F | P | — | P |
| Nylon 6 and 11 | F | P | — | P |
| PEEK (poly-ethyl-ether-ketone) | F | P | — | P— |
| Petrothene NA 226 LDPE | F | F | — | P |
| Plexar 3 EVA grafted anhydride | P | P | P | P |
| Plexar 103 EVA grafted anhydride | P | P— | P— | P |
| Plexar 104 EVA grafted anhydride | P | P— | P— | P |
| Reichold 1001 polypropylene acrylic acid terpolymer | P— | P | F | P |
| TMS white (235-9) Kynar fluoropolymer | F | P | — | P |
| Udel polysulfone | — | — | — | F |
| UE 30 EVA | — | — | — | F |
| Ultem polyamide | — | F | — | F |
| Victrex polyethersulfone | — | F | — | F |
| Viton AHV hexafluoropropylene | F | — | — | F |

F = failed,
*P— = barely passed,
$^a$— = no test conducted since marker had already failed,
$^b$P = passed Or all the materials tested, only the Plexars passed all the given requirements. The Plexars are examples of ethylene vinyl acetate modified by grafting anhydride groups. They adhered well to both board surfaces though some flow of print was experienced. In methyl cellosolve solution the markers' edges separated from the copper-clad boards. This is probably a result of the damage to the surrounding copper surface by the solvent. Reichold 1016 and Reichold 1001 also performed well but failed adhesion to the copper-clad surface in methyl cellosolve solvent. The Reichold 1001 and 1016 materials are examples of polyolefin co-polymers modified by grafting acrylic acid groups. Under slightly less rigorous testing these latter two materials would have passed the test. In practice, it is believed that Reichold 1016, Reichold 1001, and similar materials would perform admirably.

Overall, it can be seen that the modified polyolefins and the modified ethylene vinyl acetate performed superiorly to their unmodified counterparts.

It will be obvious to those skilled in the art, having regard to this disclosure that other modifications of this invention beyond those embodiments specifically described here, may be made without departing from the spirit of the invention. Accordingly, such modifications are considered to be within the scope of the invention as limited solely by the appended claims.

We claim:

1. An ultrathin chemically resistant marking system consisting essentially of at least one layer of an adhesive thermoplastic polymeric film and printed matter on at least one principal surface thereof, said adhesive film having the properties comprising adhesion to a substrate after being heated to a temperature of less than about 600° F., minimum flow characteristics after being heated so as to maintain printed matter legibility, optical clarity, chemical resistance to chemical baths of caustic solutions and methylene chloride at temperatures as high as about 190° F. and minimum transference of each of the chemical baths after being transferred between the different chemical baths; said at least one layer of adhesive film and said printed matter cooperating to form a marker.

2. An ultrathin chemically resistant marking system consisting essentially of at least one layer of an adhesive thermoplastic film made of a material selected from the group consisting of polymers having the properties comprising adhesion to a substrate after being heated to a temperature of less than about 600° F., chemical resistance to caustic solutions and methylene chloride up to about 90° F.; said at least one layer of adhesive film having a chemically resistant front and rear surface and an adhesive rear surface for adhering to a substrate; one of said front and rear surface containing printed matter; said at leat one layer of adhesive film and said printed matter cooperating to form a marker.

3. The marking system of claim 2 wherein said adhesive film is optically clear.

4. The marking system of claims 1 or 2 wherein said adhesive film is cross-linked to a depth less than its thickness.

5. The marking system of claims 1 or 2 wherein said marker is planar.

6. The marking system of claims 1 or 2 wherein said marker is wrapped around a substrate.

7. The marking system of claims 5 or 6 further including at least a second layer of the adhesive film contacting said at least one layer of adhesive film so that said printed matter is between said layers of adhesive film, said layers of adhesive film and said printed matter cooperating to form a multilayer marker.

8. The ultrathin chemically resistant marking system of claims 1 or 2 wherein said adhesive polymeric film is selected from the group consisting of polyolefins and their copolymers modified by attaching strong polar groups.

9. The ultrathin chemically resistant marking system of claim 8 wherein said strong polar groups are selected from the group consisting of anhydrides, acid groups, and cyano groups.

10. The ultrathin chemically resistant marking system of claim 8 wherein said adhesive film is polyethylene modified by attaching acrylic acid.

11. The ultra thin chemically resistant marking system of claim 8 wherein said adhesive film is polypropylene modified by attaching acrylic acid.

12. The ultrathin chemically resistant marking system of claims 1 or 2 wherein said adhesive polymeric film is ethylene vinyl acetate modified by attaching strong polar groups.

13. The ultrathin chemically resistant marking system of claim 12 wherein said strong polar groups are selected from the group consisting of anhydrides, acid groups, and cyano groups.

14. The ultrathin chemically resistant marking system of claim 12 wherein said adhesive polymeric film is ethylene vinyl acetate modified by attaching anhydride groups.

15. A method of producing an ultrathin chemically resistant marking system comprising the steps of forming an article consisting essentially of at least one layer of an adhesive film from a material selected from the group consisting of polymers having the properties comprising adhesion to a substrate after being heated to a temperature of less than about 600° F., and chemical resistance to caustic solutions and methylene chloride up to about 190° F; the at least one layer of adhesive film having a chemically resistant front and rear surface and an adhesive rear surface for adhering to a substrate; adding printed matter to one of the front and rear surface so that the at least one layer of adhesive film and the printed matter cooperate to form a marker.

16. The method of claim 15 wherein the adhesive film is optically clear.

17. The method of claim 15 wherein the method further comprises the step of cross-linking the film to a depth less than its thickness.

18. The method of claim 15 further comprising the steps of forming at least a second layer of the adhesive film; contacting the at least one layer of adhesive flim with the at least second layer of adhesive film so that the printed matter is between the layers of adhesive film.

19. The method of claim 15 wherein said adhesive polymeric film is selected from the group consisting of polyolefins and their copolymers modified by attaching strong polar groups.

20. The method of claim 19 wherein said strong polar groups are selected from the group consisting of anhydrides, acid groups, and cyano groups.

21. The method of claim 19 wherein said adhesive film is polyethylene modified by attaching acrylic acid.

22. The method of claim 19 wherein said adhesive film is polypropylene modified by attaching acrylic acid.

23. The method of claim 15 wherein said adhesive polymeric film is ethylene vinyl acetate modified by attaching strong polar groups.

24. The method of claim 23 wherein said strong polar groups are selected from the group consisting of anhydrides, acid groups, and cyano groups.

25. The method of claim 23 wherein said adhesive polymeric film is ethylene vinyl acetate modified by attaching anhydride groups.

26. The ultrathin chemically resistant marking system produced by the method of claim 15 wherein the layer of adhesive film and the printed matter cooperate to form a marker.

27. The ultrathin chemically resistant marking system produced by the method of claim 18 wherein the layers of adhesive film and the printed matter cooperate to form a multilayer marker.

28. The marking system of claims 26 or 27 wherein the marker is planar.

29. The marking system of claims 26 or 27 wherein the marker is wrapped around a substrate to form a wraparound marker.

* * * * *

UNITED STATES PATENT AND TRADEMARK OFFICE
CERTIFICATE OF CORRECTION

PATENT NO. : 4,584,238
DATED : April 22, 1986
INVENTOR(S) : Tamar Gen et al

It is certified that error appears in the above-identified patent and that said Letters Patent are hereby corrected as shown below:

In specification, col. 6, line 66, mispelled "Or" should read "Of"

Signed and Sealed this

Eighth Day of July 1986

[SEAL]

Attest:

DONALD J. QUIGG

Attesting Officer

Commissioner of Patents and Trademarks